(12) United States Patent
Lee et al.

(10) Patent No.: US 9,313,893 B2
(45) Date of Patent: Apr. 12, 2016

(54) SUBSTRATE HAVING ELECTRONIC COMPONENT EMBEDDED THEREIN AND METHOD OF MANUFACTURING THE SAME

(71) Applicant: SAMSUNG ELECTRO-MECHANICS CO., LTD., Suwon (KR)

(72) Inventors: Doo Hwan Lee, Daejeon (KR); Yul Kyo Chung, Yongin (KR); Dae Hyun Park, Suwon (KR); Yee Na Shin, Suwon (KR); Seung Eun Lee, Sungnam (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 152 days.

(21) Appl. No.: 14/143,616

(22) Filed: Dec. 30, 2013

(65) Prior Publication Data

US 2014/0182896 A1 Jul. 3, 2014

(30) Foreign Application Priority Data

Dec. 31, 2012 (KR) .......................... 10-2012-0158339

(51) Int. Cl.
*H05K 1/16* (2006.01)
*H05K 1/11* (2006.01)
*H05K 1/18* (2006.01)
(Continued)

(52) U.S. Cl.
CPC .............. *H05K 1/185* (2013.01); *H05K 1/0231* (2013.01); *H05K 3/4602* (2013.01); *H05K 3/4644* (2013.01); *H05K 2201/10015* (2013.01); *Y10T 29/49139* (2015.01)

(58) Field of Classification Search
CPC ... H05K 1/185; H05K 3/4602; H05K 3/4644; Y10T 29/49139
USPC .............. 174/260, 262; 361/761, 763; 29/837
See application file for complete search history.

(56) References Cited

U.S. PATENT DOCUMENTS

2009/0205202 A1\* 8/2009 Tanaka et al. .................. 29/834
2009/0266598 A1\* 10/2009 Katagiri et al. ................ 174/261
2010/0134991 A1\* 6/2010 Kim et al. ..................... 361/762

(Continued)

FOREIGN PATENT DOCUMENTS

JP 2002-171073 6/2002
JP 2002-223076 8/2002
(Continued)

OTHER PUBLICATIONS

Korean Office Action issued Dec. 24, 2013 in corresponding Korean Patent Application No. 10-2012-0158339.
(Continued)

*Primary Examiner* — Sherman Ng
(74) *Attorney, Agent, or Firm* — NSIP Law

(57) ABSTRACT

A substrate having an electronic component embedded therein includes a first insulating layer including a cavity and including first and second circuit patterns provided on upper and lower surfaces thereof, respectively; the electronic component at least partially inserted into the cavity and including an external electrode; a plurality of build-up insulating layers stacked on or beneath the first insulating layer; upper and lower circuit patterns formed on the build-up insulating layers, respectively; and a plurality of vias connecting the external electrode, the upper circuit pattern, the first circuit pattern, the second circuit pattern, and the lower circuit pattern.

22 Claims, 6 Drawing Sheets

(51) Int. Cl.
  *H05K 1/02* (2006.01)
  *H05K 3/46* (2006.01)

(56) References Cited

U.S. PATENT DOCUMENTS

| 2013/0081866 A1* | 4/2013 | Furutani et al. | 174/260 |
| 2013/0333930 A1* | 12/2013 | Koyanagi | 174/258 |

FOREIGN PATENT DOCUMENTS

| JP | 2012-151372 | 8/2012 |
| KR | 10-2007-0101183 | 10/2007 |
| KR | 10-2011-0100992 | 9/2011 |
| TW | 200614886 | 5/2006 |
| TW | 200731889 | 8/2007 |
| TW | 201112903 | 4/2011 |

OTHER PUBLICATIONS

Taiwanese Office Action dated Feb. 25, 2015 in corresponding Taiwanese Patent Application No. 102144749.

Korean Notice of Allowance dated Sep. 23, 2014 in corresponding Korean Patent Application No. 10-2012-0158339.

* cited by examiner

SUBSTRATE HAVING ELECTRONIC COMPONENT EMBEDDED THEREIN AND METHOD OF MANUFACTURING THE SAME

CROSS-REFERENCE TO RELATED APPLICATIONS

This application claims the foreign priority benefit under 35 U.S.C. Section 119 of Korean Patent Application Serial No. 10-2012-0158339, entitled "Substrate Having Electronic Component Embedded Therein and Method of Manufacturing the Same" filed on Dec. 31, 2012 in the Korean Intellectual Property Office, the disclosure of which is hereby incorporated by reference in its entirety into this application.

BACKGROUND

1. Field

Embodiments of the present invention relate to a substrate having an electronic component embedded therein.

2. Description of the Related Art

As performance of mobile apparatuses such as a smart phone, a tablet personal computer (PC), and the like, that have been recently released has been rapidly improved and high portability thereof has been demanded, research for miniaturization, slimness, and performance improvement of electronic components used in these mobile apparatuses has been continuously conducted.

Here, in a substrate having an electronic component embedded therein as disclosed in Patent Document 1, or the like, the electronic component is embedded in the substrate, thereby making it possible to secure a space in which extra components may be mounted on a surface of the substrate. Therefore, the substrate having an electronic component embedded therein as disclosed in Patent Document 1 has been spotlighted as a method for implementing miniaturization, slimness, and performance improvement of the electronic components in the mobile apparatus.

Particularly, as performance of a semiconductor chip has been improved, stability of power supplied to the semiconductor chip becomes important. To this end, a decoupling capacitor or a bypass capacitor are provided between the semiconductor chip and a power supply line to remove noise of the power and allow stable power to be supplied to the semiconductor chip even in a state in which a power supply current is suddenly changed.

Here, when the semiconductor chip is mounted on the substrate having a capacitor embedded therein, since a distance between the decoupling capacitor and the semiconductor chip may be minimized, the high performance semiconductor chip may be supplied with the stable power and be miniaturized and slimmed.

Meanwhile, in order to allow the electronic components such as the semiconductor chip, the capacitor, or the like, to reveal their maximum performance in a state in which they are embedded in the substrate, impedance of a path through which these electronic components are connected to other devices should be lowered.

However, related arts including Korean Patent Laid-Open Publication No. 2007-0101183, or the like, have not disclosed an effective means for decreasing impedance. Therefore, even though performance of the electronic components has been rapidly improved, a technology for embedding these electronic components has not been sufficiently supported, such that the performance of the electronic components has not been sufficiently utilized.

SUMMARY

An aspect of the present invention is to provide a technology capable of decreasing impedance of a path through which an external device is connected to an electronic component.

According to an exemplary embodiment of the present invention, there is provided a substrate having an electronic component embedded therein, including: the electronic component including an external electrode; a first insulating layer including a cavity into which at least a portion of the electronic component is inserted and including a first circuit pattern provided on one surface thereof and a second circuit pattern provided on the other surface thereof; a second insulating layer covering the first circuit pattern and one surface of the first insulating layer; a third insulating layer covering the second circuit pattern and the other surface of the first insulating layer; a third circuit pattern provided on a surface of the second insulating layer; a fourth circuit pattern provided on a surface of the third insulating layer; a first via directly connecting the external electrode and the third circuit pattern to each other while penetrating through the second insulating layer; a second via directly connecting the first circuit pattern and the third circuit pattern to each other while penetrating through the second insulating layer; a third via directly connecting the first circuit pattern and the second circuit pattern to each other while penetrating through the first insulating layer; and a fourth via directly connecting the second circuit pattern and the fourth circuit pattern to each other while penetrating through the third insulating layer, wherein the entire lower surface of the second via is positioned on the first circuit pattern.

The lower surface of the second via and an upper surface of the third via may be at least partially overlapped with each other while having the first circuit pattern therebetween.

A lower surface of the third via and an upper surface of the fourth via may be at least partially overlapped with each other while having the second circuit pattern therebetween.

A width of the first circuit pattern at a region including the third via may be 170 to 200 μm, and a difference between a distance between a center line of the first via and a center line of the second via and a distance between the center line of the first via and a center line of the third via may be less than 50 μm.

The shortest distance from a sidewall of the electronic component to a center line of the third via may be equal to or larger than the sum of a minimum value of an allowable distance between the sidewall of the electronic component and the cavity, a minimum value of an allowable distance between the cavity and the first circuit pattern, and a minimum value of an allowable distance between one side surface of the first circuit pattern and the center line of the third via.

The minimum value of the allowable distance between the sidewall of the electronic component and the cavity may be less than 120 μm, the minimum value of the allowable distance between the cavity and the first circuit pattern may be 30 to 50 μm, and the minimum value of the allowable distance between one side surface of the first circuit pattern and the center line of the third via may be 40 to 140 μm.

The number of first vias may be plural.

The electronic component may be a multilayered ceramic capacitor (MLCC).

The substrate having an electronic component embedded therein may further include an active element having an external terminal contacting the third circuit pattern.

The substrate having an electronic component embedded therein may further include a fifth via directly connecting the external electrode and the fourth circuit pattern to each other while penetrating through the third insulating layer, wherein the number of fifth vias is plural.

According to another exemplary embodiment of the present invention, there is provided a substrate having an electronic component embedded therein, including: a first insulating layer including a cavity and including first and second circuit patterns provided on upper and lower surfaces thereof, respectively; the electronic component at least partially inserted into the cavity and including an external electrode; a plurality of build-up insulating layers stacked on or beneath the first insulating layer; upper and lower circuit patterns formed on the build-up insulating layers, respectively; and a plurality of vias connecting the external electrode, the upper circuit pattern, the first circuit pattern, the second circuit pattern, and the lower circuit pattern to one another to form an electrical loop.

The plurality of build-up insulating layers may include: a second insulating layer covering the first circuit pattern and the upper surface of the first insulating layer; and a third insulating layer covering the second circuit pattern and the lower surface of the first insulating layer.

The upper circuit pattern may include a third circuit pattern provided on a surface of the second insulating layer, and the lower circuit pattern may include a fourth circuit pattern provided on a surface of the third insulating layer.

The plurality of vias may include: a first via directly connecting the external electrode and the third circuit pattern to each other while penetrating through the second insulating layer; a second via directly connecting the first circuit pattern and the third circuit pattern to each other while penetrating through the second insulating layer; a third via directly connecting the first circuit pattern and the second circuit pattern to each other while penetrating through the first insulating layer; a fourth via directly connecting the second circuit pattern and the fourth circuit pattern to each other while penetrating through the third insulating layer; and a fifth via directly connecting the external electrode and the fourth circuit pattern to each other while penetrating through the third insulating layer.

A lower surface of the second via and an upper surface of the third via may be at least partially overlapped with each other while having the first circuit pattern therebetween.

A lower surface of the third via and an upper surface of the fourth via may be at least partially overlapped with each other while having the first circuit pattern therebetween.

According to still another exemplary embodiment of the present invention, there is provided a method of manufacturing a substrate having an electronic component embedded therein, the method including: providing a first insulating layer including a cavity; inserting at least a portion of the electronic component including an external electrode into the cavity, forming a first circuit pattern on an upper surface of the first insulating layer, forming a second circuit pattern on a lower surface of the first insulating layer, and forming a third via directly connecting the first circuit pattern and the second circuit pattern to each other while penetrating through the first insulating layer; forming a plurality of build-up insulating layers on and beneath the first insulating layer, respectively; forming a plurality of via holes penetrating the plurality of build-up insulating layers; and filling conductive materials in the plurality of via holes to form a plurality of vias and forming an upper circuit pattern and a lower circuit pattern on the build-up insulating layers, respectively, wherein the external electrode, the upper circuit pattern, the first circuit pattern, the second circuit pattern, and the lower circuit pattern are connected to one another by the plurality of vias to form an electrical loop.

The plurality of build-up insulating layers may include: a second insulating layer covering the first circuit pattern and the upper surface of the first insulating layer; and a third insulating layer covering the second circuit pattern and the lower surface of the first insulating layer, the upper circuit pattern may include a third circuit pattern provided on a surface of the second insulating layer, the lower circuit pattern may include a fourth circuit pattern provided on a surface of the third insulating layer, and the plurality of vias may include: a first via directly connecting the external electrode and the third circuit pattern to each other while penetrating through the second insulating layer; a second via directly connecting the first circuit pattern and the third circuit pattern to each other while penetrating through the second insulating layer; a fourth via directly connecting the second circuit pattern and the fourth circuit pattern to each other while penetrating through the third insulating layer; and a fifth via directly connecting the external electrode and the fourth circuit pattern to each other while penetrating through the third insulating layer.

A lower surface of the second via and an upper surface of the third via may be at least partially overlapped with each other while having the first circuit pattern therebetween.

According to another exemplary embodiment a substrate having an electronic component embedded therein includes: a first insulating layer including a cavity; a second insulating layer stacked on an upper surface of the first insulating layer; a third insulating layer stacked on a lower surface of the first insulating layer; the electronic component at least partially inserted into the cavity and including an external electrode; a circuit pattern on an upper surface of the second insulating layer; a first via penetrating through a portion of the second insulating layer above the electronic component and connecting the external electrode with the circuit pattern; a second via connected to the circuit pattern and penetrating through the second insulating layer; a third via penetrating through a portion of the first insulating layer outside the cavity, connected to the second via, and positioned under a portion of the second via; and a fourth via penetrating through the third insulating layer, connected to the third via, and positioned under a portion of the third via.

Additional aspects and/or advantages will be set forth in part in the description which follows and, in part, will be apparent from the description, or may be learned by practice of the invention.

BRIEF DESCRIPTION OF THE DRAWINGS

These and/or other aspects and advantages will become apparent and more readily appreciated from the following description of the embodiments, taken in conjunction with the accompanying drawings of which:

FIGS. 6A through 6F are process cross-sectional views schematically showing a method of manufacturing a substrate having an electronic component embedded therein according to the exemplary embodiment of the present invention, wherein FIG. 6A is a view schematically showing a state in which a first insulating layer is provided; FIG. 6B is a view schematically showing a state in which a first circuit pattern, a second circuit pattern, a third via, and a cavity are formed at the first insulating layer and an electronic component is positioned in the cavity; FIG. 6C is a view schematically showing a state in which a second insulating layer and a third insulating layer are formed; FIG. 6D is a view schematically showing a state in which via holes are formed in the second insulating layer and the third insulating layer; FIG. 6E is a view schematically showing a state in which first to sixth vias, a third circuit pattern, and a fourth circuit pattern are formed; and FIG. 6F is a view schematically showing a state in which an active element is mounted.

DESCRIPTION OF EMBODIMENTS

Figure 1:
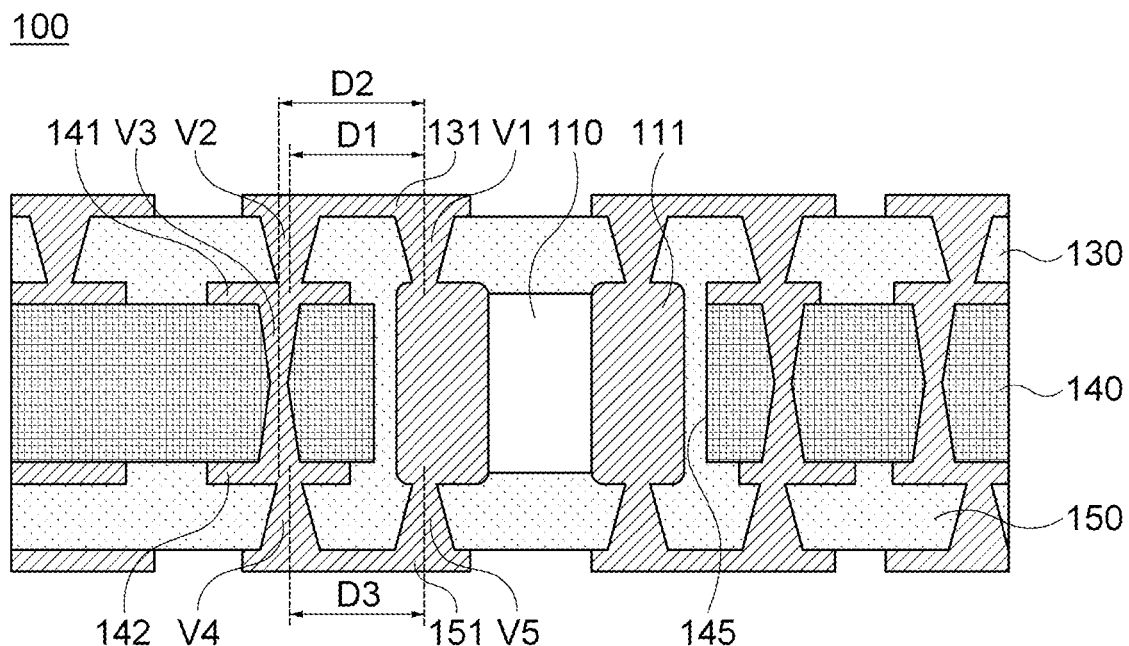
FIG. 1 is a cross-sectional view schematically showing a substrate having an electronic component embedded therein according to an exemplary embodiment of the present invention.

Various advantages and features of the present invention and methods accomplishing thereof will become apparent from the following description of exemplary embodiments with reference to the accompanying drawings. However, the present invention may be modified in many different forms and it should not be limited to exemplary embodiments set forth herein. These exemplary embodiments may be provided so that this disclosure will be thorough and complete, and will fully convey the scope of the invention to those skilled in the art. Like reference numerals throughout the description denote like elements.

Terms used in the present specification are for explaining exemplary embodiments rather than limiting the present invention. Unless explicitly described to the contrary, a singular form includes a plural form in the present specification. The word "comprise" and variations such as "comprises" or "comprising," will be understood to imply the inclusion of stated constituents, steps, operations and/or elements but not the exclusion of any other constituents, steps, operations and/or elements.

For simplification and clearness of illustration, a general configuration scheme will be shown in the accompanying drawings, and a detailed description of the feature and the technology well known in the art will be omitted in order to prevent a discussion of exemplary embodiments of the present invention from being unnecessarily obscure. Additionally, components shown in the accompanying drawings are not necessarily shown to scale. For example, sizes of some components shown in the accompanying drawings may be exaggerated as compared with other components in order to assist in understanding of exemplary embodiments of the present invention. Like reference numerals on different drawings will denote like components, and similar reference numerals on different drawings will denote similar components, but are not necessarily limited thereto.

In the specification and the claims, terms such as "first", "second", "third", "fourth", and the like, if any, will be used to distinguish similar components from each other and be used to describe a specific sequence or a generation sequence, but is not necessarily limited thereto. It may be understood that these terms are compatible with each other under an appropriate environment so that exemplary embodiments of the present invention to be described below may be operated in a sequence different from a sequence shown or described herein. Likewise, in the present specification, in the case in which it is described that a method includes a series of steps, a sequence of these steps suggested herein is not necessarily a sequence in which these steps may be executed. That is, any described step may be omitted and/or any other step that is not described herein may be added to the method.

In the specification and the claims, terms such as "left", "right", "front", "rear", "top", "bottom", "over", "under", and the like, if any, do not necessarily indicate relative positions that are not changed, but are used for description. It may be understood that these terms are compatible with each other under an appropriate environment so that exemplary embodiments of the present invention to be described below may be operated in a direction different from a direction shown or described herein. A term "connected" used herein is defined as being directly or indirectly connected in an electrical or non-electrical scheme. Targets described as being "adjacent to" each other may physically contact each other, be close to each other, or be in the same general range or region, in the context in which the above phrase is used. Here, a phrase "in an exemplary embodiment" means the same exemplary embodiment, but is not necessarily limited thereto.

Hereinafter, a configuration and an acting effect of exemplary embodiments of the present invention will be described in more detail with reference to the accompanying drawings.

FIG. 1 is a cross-sectional view schematically showing a substrate 100 having an electronic component embedded therein according to an exemplary embodiment of the present invention.

Figure 2:
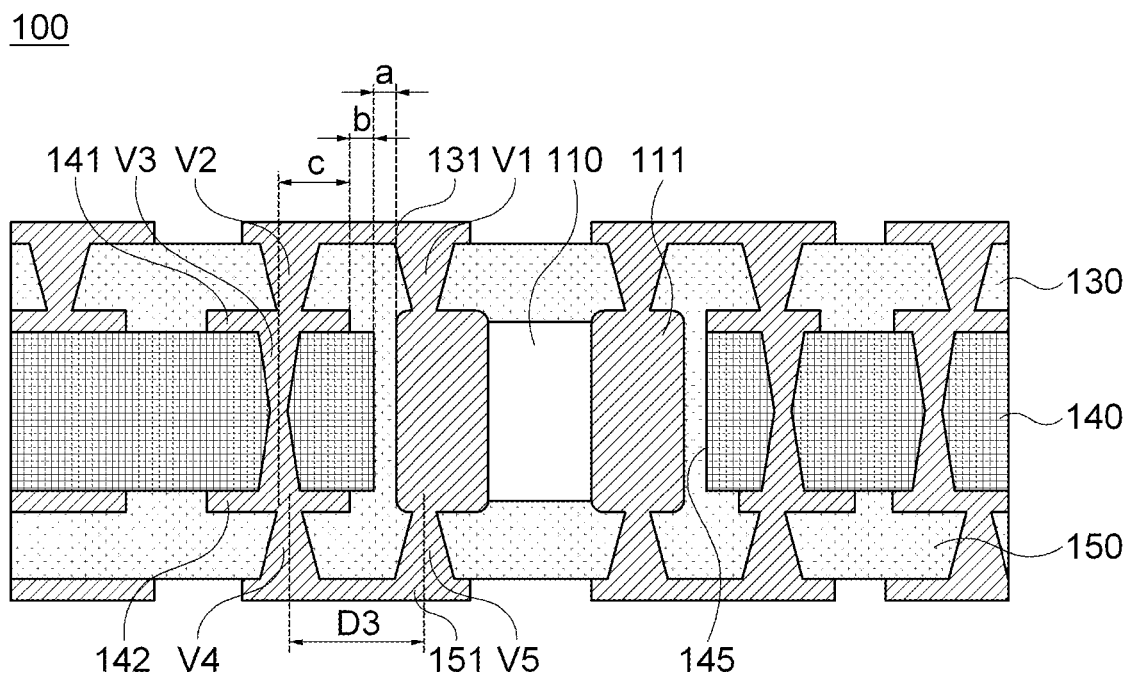
FIG. 2 is a cross-sectional view schematically showing the substrate having an electronic component embedded therein according to the exemplary embodiment of the present invention.

FIG. 2 is a cross-sectional view schematically showing the substrate 100 having an electronic component embedded therein according to the exemplary embodiment of the present invention.

Referring to FIGS. 1 and 2, the substrate 100 having an electronic component embedded therein according to the exemplary embodiment of the present invention may be configured to include the electronic component 110, a plurality of insulating layers, a plurality of circuit patterns, and a plurality of vias.

First, the electronic component 110 may be an active element (as in the case of active element 190) such as a semiconductor chip, or the like, including an external electrode 111 or terminal or a passive element such as a capacitor, or the like, and be embedded in the substrate 100 having an electronic component embedded therein.

Next, the first insulating layer 140 may include a cavity 145 so that the electronic component 110 may be inserted thereinto.

In addition, the first insulating layer 140 may include a first circuit pattern 141 and a second circuit pattern 142 disposed on an upper surface and a lower surface thereof, respectively, wherein the first circuit pattern 141 and the second circuit pattern 142 may be electrically connected to each other by a third via V3 penetrating through the first insulating layer 140.

Here, the first insulating layer 140 may be a core substrate or a metal core including a metal material.

Next, build-up insulating layers may be formed on and beneath the first insulating layers 140. Therefore, the insulating layer formed on the first insulating layer 140 may be defined as a second insulating layer 130, and the insulating layer formed beneath the first insulating layer 140 may be defined as a third insulating layer 150.

Here, the second insulating layer 130 and the third insulating layer 150 may cover the first insulating layer 140 and the electronic component 110 at upper and lower portions of the first insulating layer 140 and the electronic component 110, respectively.

Meanwhile, the build-up insulating layers may have an upper circuit pattern formed thereon and have a lower circuit pattern formed therebeneath. That is, a third circuit pattern 131 provided on an upper surface of the second insulating layer 130 may correspond to the upper circuit pattern, and a fourth circuit pattern 151 provided on a lower surface of the third insulating layer 150 may correspond to the lower circuit pattern.

In addition, the plurality of vias may be formed in the build-up insulating layers to electrically connect the circuit patterns or the external electrode 111 of the electronic component 110 to an external device.

Particularly, in the present specification, the plurality of vias will be defined as follows for convenience of explanation.

A via having one surface contacting the external electrode 111 and the other surface contacting the third circuit pattern 131 while penetrating through the second insulating layer 130 may be defined as a first via V1, and a via having the other surface contacting the third circuit pattern 131 and one surface contacting the first circuit pattern 141 may be defined as a second via V2.

In addition, a via connecting the first circuit pattern 141 and the second circuit pattern 142 to each other while penetrating through the first insulating layer 140 may be defined as the third via V3 as described above.

In addition, a via having one surface contacting the second circuit pattern 142 and the other surface contacting the fourth circuit pattern 151 while penetrating through the third insulating layer 150 may be defined as a fourth via V4, and a via having one surface contacting the external electrode 111 and the other surface contacting the fourth circuit pattern 151 may be defined as a fifth via V5.

As described above, the external electrode 111, the first via V1, the third circuit pattern 131, the second via V2, the first circuit pattern 141, the third via V3, the second circuit pattern 142, the fourth via V4, the fourth circuit pattern 151, and the fifth via V5 may form an electrical loop. Therefore, impedance may be decreased.

The following Table 1 is a table in which impedance values according to the number of first vias V1, the number of fifth vias V5, and distances between the vias are arranged.

In Table 1, D1 means a distance from a center line of the first via V1 and a center line of the second via V2, D2 means a distance from the center line of the first via V1 to a center line of the third via V3, and D3 means a distance from a center line of the fourth via V4 to a center line of the fifth via V5.

In addition, as the electronic component 110, a multilayered ceramic capacitor (MLCC) that includes the external electrode 111 having an electrode width 220 μm or more and has a size of 1000×500 μm or more has been used, and impedance has been simulated in a state in which a thickness of the first insulating layer 140 is 100 μm, a thickness of the second insulating layer 130 is 40 to 50 μm, and a thickness of the third insulating layer 150 is 40 to 50 μm.

Further, some of the samples included in the following Table 1 were actually manufactured to actually measure impedance values, thereby verifying a simulation result.

TABLE 1

| Division | Number of V1 | Number of V5 | D1 | D3 | D2 | Impedance (Ω) |
|---|---|---|---|---|---|---|
| #1 | 1 | 0 | 200 | — | 200 | 4.1581 |
| #2 | 1 | 1 | 200 | 200 | 200 | 4.2094 |
| #3 | 1 | 2 | 200 | 200 | 200 | 4.2041 |
| #4 | 1 | 1 | 200 | 300 | 200 | 4.2171 |
| #5 | 1 | 2 | 200 | 300 | 200 | 4.2171 |
| #6 | 1 | 0 | 200 | — | 300 | 5.511 |
| #7 | 1 | 1 | 200 | 200 | 300 | 5.8938 |
| #8 | 1 | 2 | 200 | 200 | 300 | 5.898 |
| #9 | 1 | 1 | 200 | 300 | 300 | 6.0151 |
| #10 | 1 | 2 | 200 | 300 | 300 | 6.0151 |
| #11 | 1 | 0 | 300 | — | 200 | 5.5866 |
| #12 | 1 | 1 | 300 | 200 | 200 | 5.9134 |
| #13 | 1 | 2 | 300 | 200 | 200 | 5.9343 |
| #14 | 1 | 1 | 300 | 300 | 200 | 5.9356 |
| #15 | 1 | 2 | 300 | 300 | 200 | 5.9522 |
| #16 | 1 | 0 | 300 | — | 300 | 4.2312 |
| #17 | 1 | 1 | 300 | 200 | 300 | 4.2819 |
| #18 | 1 | 2 | 300 | 200 | 300 | 4.2759 |
| #19 | 1 | 1 | 300 | 300 | 300 | 4.2827 |
| #20 | 1 | 2 | 300 | 300 | 300 | 4.2894 |
| #21 | 2 | 0 | 200 | — | 200 | 4.1648 |
| #22 | 2 | 1 | 200 | 200 | 200 | 4.2164 |
| #23 | 2 | 2 | 200 | 200 | 200 | 4.2051 |
| #24 | 2 | 1 | 200 | 300 | 200 | 4.2242 |
| #25 | 2 | 2 | 200 | 300 | 200 | 4.2182 |
| #26 | 2 | 0 | 200 | — | 300 | 5.5001 |
| #27 | 2 | 1 | 200 | 200 | 300 | 5.8927 |
| #28 | 2 | 2 | 200 | 200 | 300 | 5.899 |
| #29 | 2 | 1 | 200 | 300 | 300 | 6.0162 |
| #30 | 2 | 2 | 200 | 300 | 300 | 6.0046 |
| #31 | 2 | 0 | 300 | — | 200 | 5.575 |
| #32 | 2 | 1 | 300 | 200 | 200 | 5.9134 |
| #33 | 2 | 2 | 300 | 200 | 200 | 5.9351 |
| #34 | 2 | 1 | 300 | 300 | 200 | 5.9346 |
| #35 | 2 | 2 | 300 | 300 | 200 | 5.9531 |
| #36 | 2 | 0 | 300 | — | 300 | 4.2321 |
| #37 | 2 | 1 | 300 | 200 | 300 | 4.2766 |
| #38 | 2 | 2 | 300 | 200 | 300 | 4.277 |
| #39 | 2 | 1 | 300 | 300 | 300 | 4.2837 |
| #40 | 2 | 2 | 300 | 300 | 300 | 4.2904 |

Referring to Table 1, it may be understood that there is a tendency that the shorter D1 and D2, the smaller the impedance. In addition, the smaller the difference between D1 and D2, the smaller the impedance. Further, the more the number of first vias V1 or fifth vias V5, the smaller the impedance.

Particularly, it may be confirmed that there is a tendency that the smaller the difference between D1 and D2, the smaller the impedance even though D1 or D2 becomes large. That is, the closer to each other the center lines of the second via V2 and the third via V3, the smaller the impedance characteristics.

When considering these experimental data, it may be understood that it is advantageous in decreasing the impedance that a lower surface of the second via V2 and an upper surface of the third via V3 contacting the first circuit pattern 141 are at least partially overlapped with each other.

In addition, it may be understood that it is advantageous in decreasing the impedance by the same principle as the above-mentioned principle that a lower surface of the third via V3 and an upper surface of the fourth via V4 contacting the second circuit pattern 142 are at least partially overlapped with each other.

Further, when analyzing a result of Table 1, it may be appreciated that the impedance is significantly decreased in the case in which the difference between D1 and D2 is 0 μm as compared with the case in which the difference between D1 and D2 is 100 μm. When considering this point, it is in accordance with one aspect of the invention that the difference between D1 and D2 is less than 50 μm.

Furthermore, in a general process of embedding the electronic component 110 according to the related art, a diameter of the third via V3 is in a range 80 to 100 μm and a width of the first circuit pattern 141 is in a range of 170 to 200 μm. Therefore, when the second via V2 or the third via V3 is formed on the first circuit pattern 141, an allowable deviation of one side becomes less than 50 μm. Therefore, also in this viewpoint, it is in accordance with one aspect of the invention that the difference between D1 and D2 is less than 50 μm.

Meanwhile, referring to FIG. 2, the shortest distance from a sidewall of the electronic component 110 to the center line of the third via V3 may be equal to or larger than the sum of minimum values of a, b, and c.

Here, a indicates an allowable distance between the sidewall of the electronic component 110 and the cavity 145, b indicates an allowable distance between the cavity 145 and the first circuit pattern 141, and c indicates an allowable distance between one side surface of the first circuit pattern 141 and the center line of the third via V3.

First, a, which is a value that may be determined in consideration of a size deviation of the electronic component 110, a mounting position deviation in mounting the electronic component 110 in the cavity 145, and a processing deviation of the cavity 145, may be defined as a value less than 120 μm.

In addition, b may correspond to a distance at which the circuit pattern is at least spaced apart from an edge of the cavity 145 when the circuit pattern is formed on the insulating layer, be changed according to a shape of the cavity 145 or a processing method of the cavity 145, and be generally 30 to 50 μm.

Next, c is an allowable distance for allowing the via and the circuit pattern to be matched to each other when the circuit pattern contacting the via is formed.

When it is assumed that the center of the circuit pattern and the center of the via accurate coincide with each other, an outside line of a surface on which the via and the circuit pattern contact each other and one side surface of the circuit pattern are designed to have a spaced distance of about 20 μm or more therebetween. Therefore, c may have a value of 40 to 140 μm.

Therefore, the smaller the distance between the center line of the first via V1 and the center line of the second via V2 and the distance between the center line of the first via V1 and the center line of the third via V3, more specifically, the smaller the difference between the above-mentioned two distances, the smaller the impedance, and the third via V3 and the sidewall of the electronic component 110 are spaced from each other by a minimum value or more allowed in a process, thereby making it possible to maximize an impedance decreasing effect.

Figure 3:
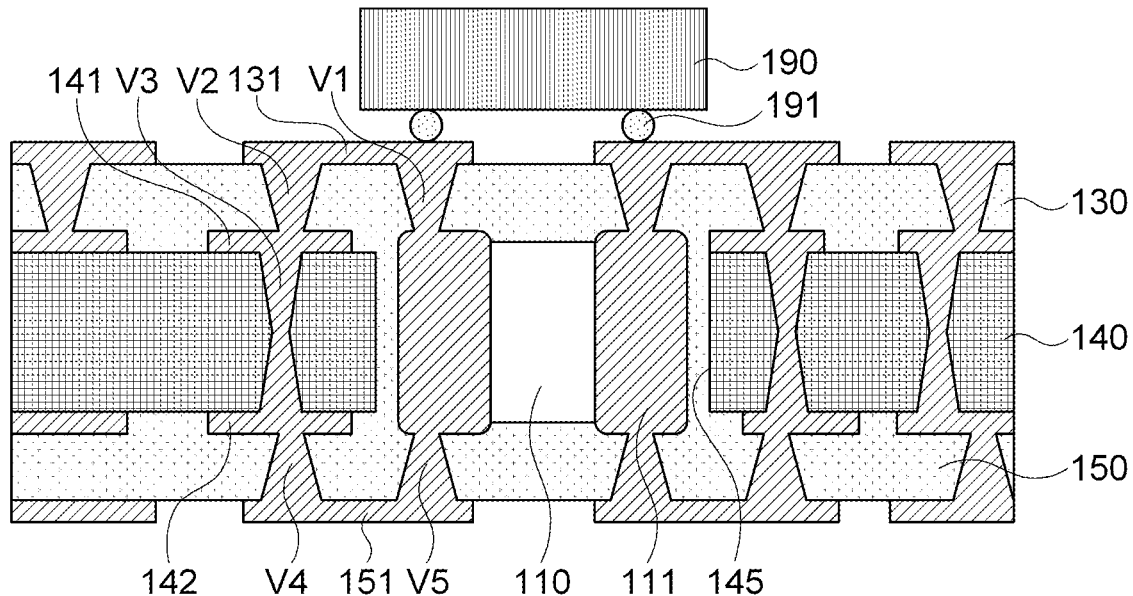
FIG. 3 is a cross-sectional view schematically showing a substrate having an electronic component embedded therein according to another exemplary embodiment of the present invention.

FIG. 3 is a cross-sectional view schematically showing a substrate 200 having an electronic component embedded therein according to another exemplary embodiment of the present invention.

Referring to FIG. 3, an active element 190 such as a semiconductor chip, or the like, may be provided over a third circuit pattern 131 and be electrically connected to an electronic component 110 by connecting an external terminal 191, or the like, provided on a lower surface thereof to the third circuit pattern 131.

In addition, as described above, in the substrate 100 having an electronic component embedded therein according to the exemplary embodiment of the present invention, since the impedance of the path through which the electronic component 110 is connected to the outside through the vias, the circuit patterns, and the like, may be decreased as compared with the related art, when the active element 190 is electrically connected to the upper surface of the third circuit pattern 131, current or signal transmission efficiency between the electronic component 110 and the active element 190 may be improved as compared with the related art.

Figure 4A:
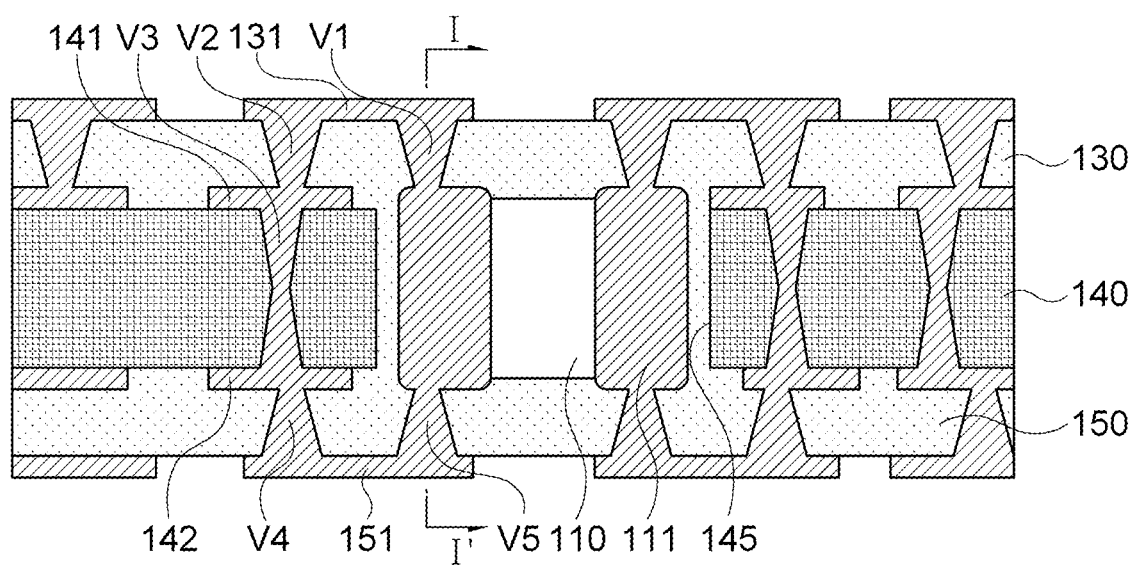
FIG. 4A is a cross-sectional view schematically showing the substrate having an electronic component embedded therein according to the exemplary embodiment of the present invention.
Figure 4B:
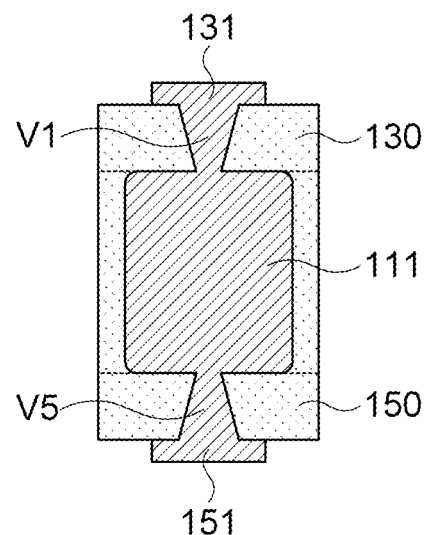
FIG. 4B is a cross-sectional view schematically showing the substrate having an electronic component embedded therein according to the exemplary embodiment of the present invention taken along the line I-I' of FIG. 4A.

FIG. 4A is a cross-sectional view schematically showing the substrate having an electronic component embedded therein according to the exemplary embodiment of the present invention; FIG. 4B is a cross-sectional view schematically showing the substrate having an electronic component embedded therein according to the exemplary embodiment of the present invention taken along the line I-I' of FIG. 4A; and FIG. 4C is a cross-sectional view schematically showing the substrate having an electronic component embedded therein according to another exemplary embodiment of the present invention taken along the line I-I' of FIG. 4A.

Figure 4C:
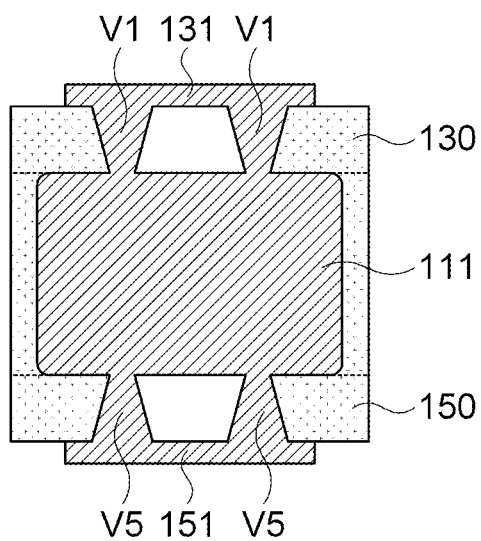
FIG. 4C is a cross-sectional view schematically showing the substrate having an electronic component embedded therein according to another exemplary embodiment of the present invention taken along the line I-I' of FIG. 4A.

Referring to FIGS. 4A to 4C, each of the numbers of first and fifth vias V1 and V5 contacting the external electrodes 111 of the electronic component 110 may be at least one.

Again referring to Table 1, the more the number of first vias V1, the smaller the impedance, and the more the number of second vias V2, the smaller the impedance.

Therefore, one first via V1 and one fifth via V5 may contact the external electrode 111 of the electronic component 110 as shown in FIG. 4B or two or more first vias V1 and two or more fifth vias V5 may contact the external electrode 111 of the electronic component 110 as shown in FIG. 4C.

Figure 5:
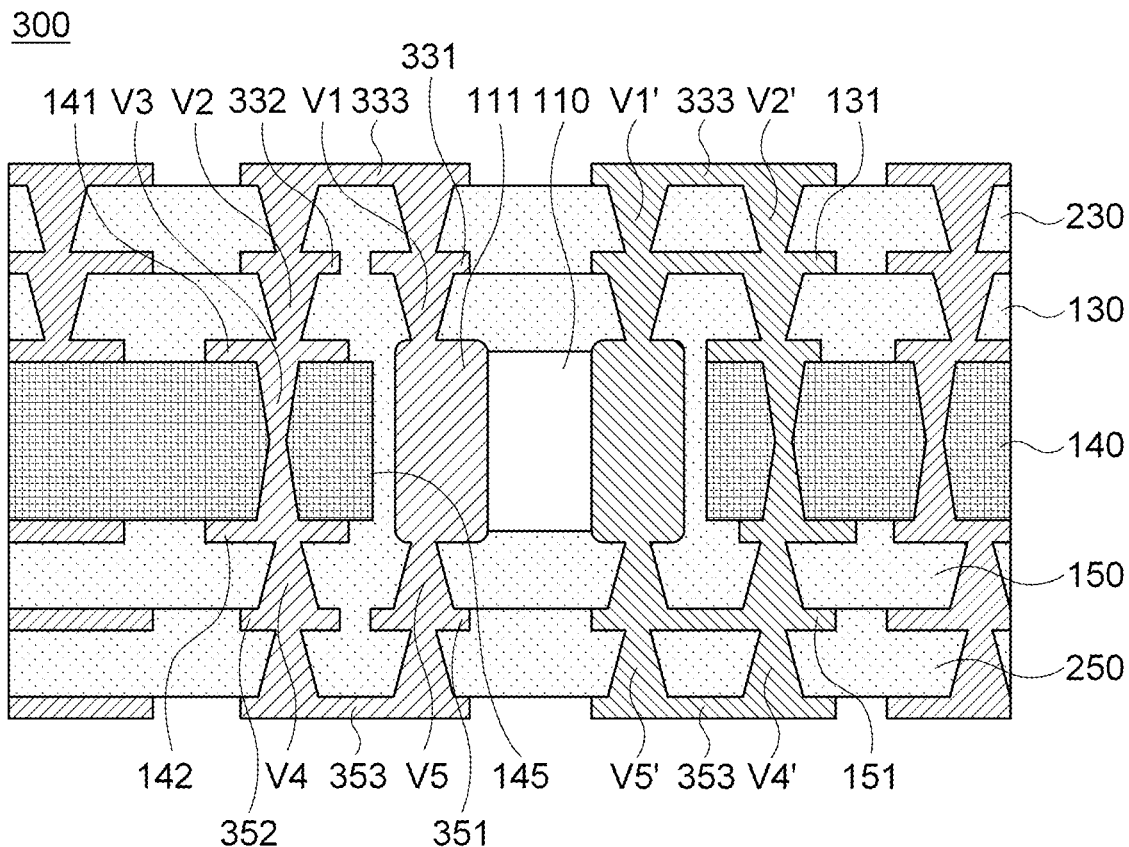
FIG. 5 is a cross-sectional view schematically showing a substrate having an electronic component embedded therein according to still another exemplary embodiment of the present invention.

FIG. 5 is a cross-sectional view schematically showing a substrate 300 having an electronic component embedded therein according to still another exemplary embodiment of the present invention.

Referring to FIG. 5, it may be understood that a fourth insulating layer 230 may be further provided on the second insulating layer 130 and a fifth insulating layer 250 may be further provided beneath the third insulating layer 150.

That is, the built-up insulating layer may also include four or more layers as needed.

Meanwhile, a loop formed by a plurality of vias and circuit patterns connected to an external electrode 111 may be configured of the external electrode 111, a first via V1, a fifth circuit pattern 331, a first additional via V1', a seventh circuit pattern 333, a second additional via V2', a sixth circuit pattern 332, a second via V2, a first circuit pattern 141, a third via V3, a second circuit pattern 142, a fourth via V4, a ninth circuit pattern 352, a fourth additional via V4', a tenth circuit pattern 353, a fifth additional via V5', an eighth circuit pattern 351, and a fifth via V5.

In addition, the loop may also be a multi-loop including a loop passing through the third circuit pattern 131 and the fourth circuit pattern 151 and a loop passing through the seventh circuit pattern 333 and the tenth circuit pattern 353.

FIGS. 6A through 6F are process cross-sectional views schematically showing a method of manufacturing a substrate having an electronic component embedded therein according to the exemplary embodiment of the present invention.

Figure 6A:
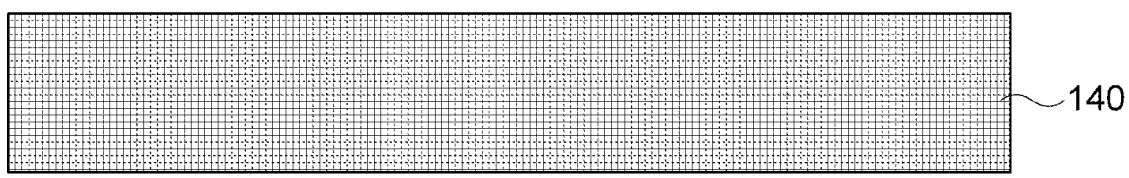
Figure 6B:
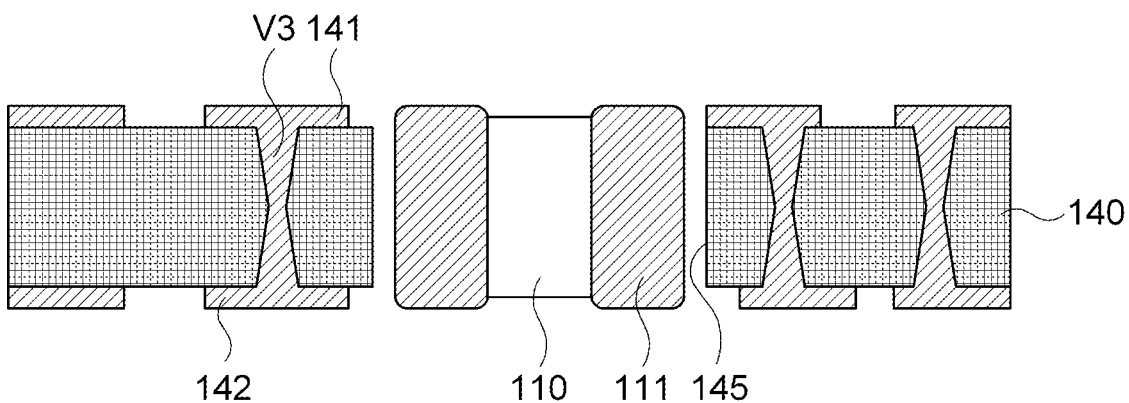

First, referring to FIGS. 6A and 6B, the first circuit pattern 141, the second circuit pattern 142, the third via V3, and the cavity 145 may be formed at the first insulating layer 140, and the electronic component 110 may be positioned in the cavity 145.

Here, a sequence of a process of forming the first circuit pattern 141, the second circuit pattern 142, and the third via V3 and a process of positioning the electronic component 110 in the cavity 145 may be appropriately selected as needed.

Figure 6C:
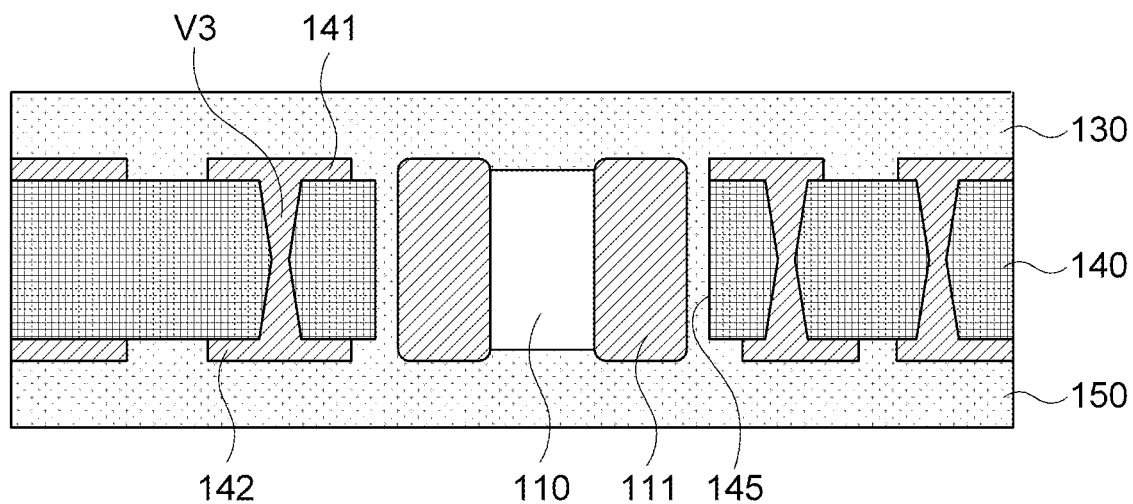

Then, referring to FIG. 6C, the second insulating layer 130 and the third insulating layer 150 may be formed.

Although not shown, after the second insulating layer 130 is formed, the third insulating layer 150 may be formed.

For example, in seating the electronic component 110 in the cavity 145 of the first insulating layer 140, after the electronic component 110 is fixed in a state in which a detach film contacting the second circuit pattern 142 is provided, the second insulating layer 130 is formed, thereby making it possible to fix the electronic component 110 to an inner portion of the cavity 145. Then, the detach film may be removed, and the third insulating layer 150 may be formed.

Figure 6D:
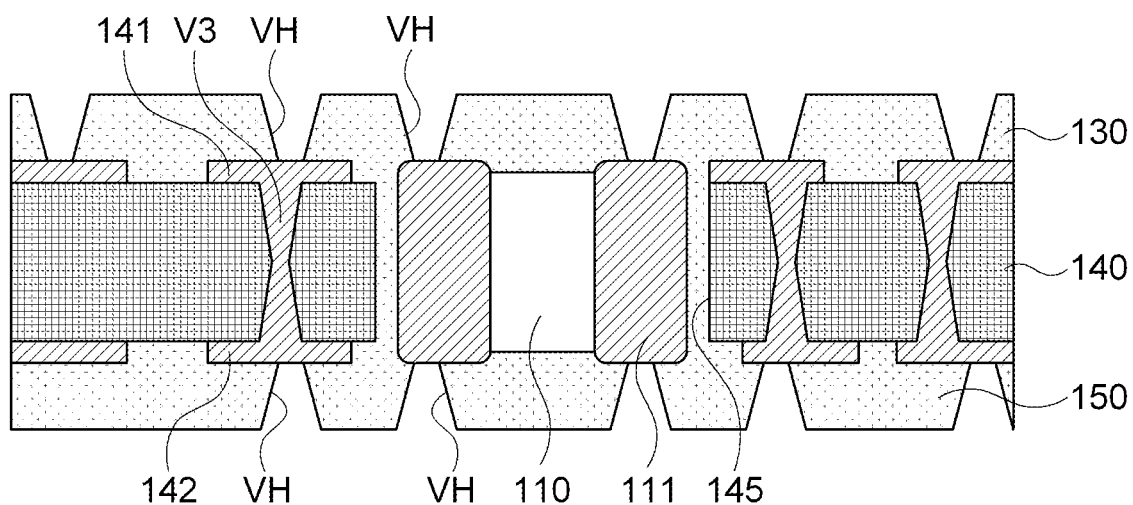

Next, referring to FIG. 6D, via holes VH exposing the external electrode 111, the first circuit pattern 141, the second circuit pattern 142, and the like, may be processed.

Figure 6E:
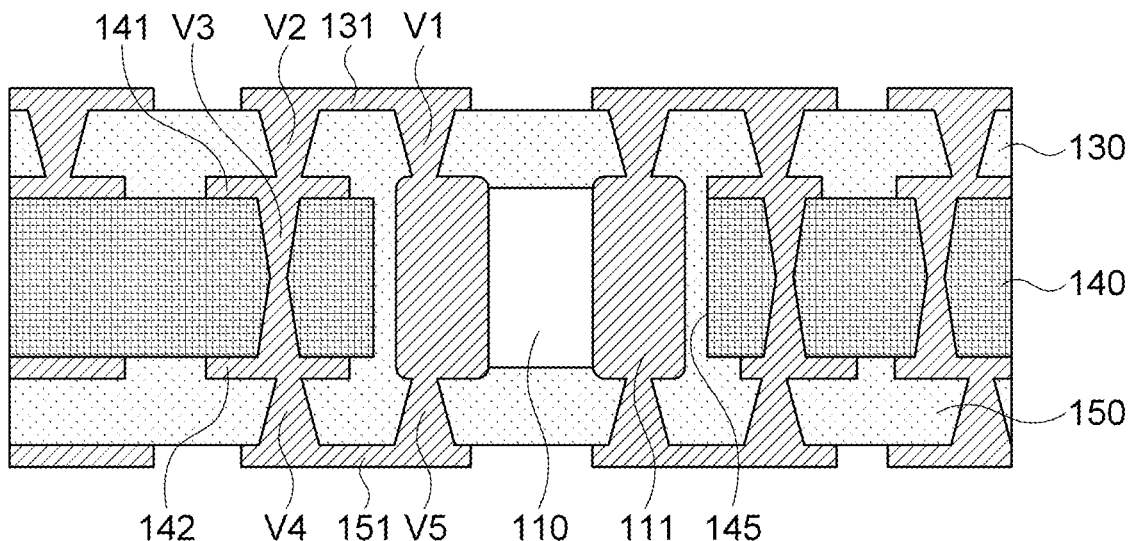

Thereafter, referring to FIG. 6E, conductive materials may be filled in the via holes VH by a printing method, a plating method, or the like, to form the first to fifth vias V1 to V5. Then, the third circuit pattern 131 and the fourth circuit pattern 151 may be formed.

Figure 6F:
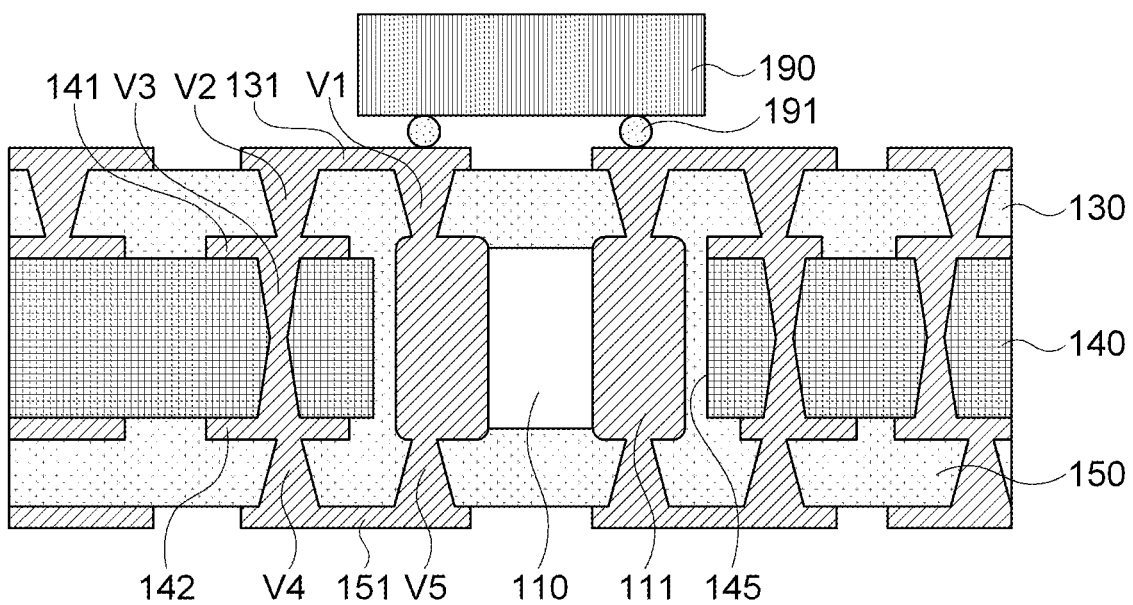

Next, referring to FIG. 6F, the active element 190 may be connected to the upper surface of the third circuit pattern 131.

Since other features are overlapped with those of the above-mentioned description, a description thereof will be omitted.

With the exemplary embodiments of the present invention configured as described above, impedance of a path through which the electronic component and an external device are connected to each other may be decreased as compared with the related art.

What is claimed is:

1. A substrate having an electronic component embedded therein, comprising:
   the electronic component including an external electrode;
   a first insulating layer including a cavity into which at least a portion of the electronic component is inserted and having a first circuit pattern provided on one surface thereof and a second circuit pattern provided on the other surface thereof;
   a second insulating layer covering the first circuit pattern and one surface of the first insulating layer;
   a third insulating layer covering the second circuit pattern and the other surface of the first insulating layer;
   a third circuit pattern provided on a surface of the second insulating layer;
   a fourth circuit pattern provided on a surface of the third insulating layer;
   a first via directly connecting the external electrode and the third circuit pattern to each other while penetrating through the second insulating layer;
   a second via directly connecting the first circuit pattern and the third circuit pattern to each other while penetrating through the second insulating layer;
   a third via directly connecting the first circuit pattern and the second circuit pattern to each other while penetrating through the first insulating layer;
   a fourth via directly connecting the second circuit pattern and the fourth circuit pattern to each other while penetrating through the third insulating layer; and
   a fifth via directly connecting the external electrode and the forth circuit pattern to each other while penetrating through the third insulating layer,
   wherein an electrical loop is formed by connections from the external electrode to the third circuit pattern through the first via, from the third circuit pattern to the first circuit pattern through the second via, from the first circuit pattern to the second circuit pattern through the third via, from the second circuit pattern to the fourth circuit pattern though the fourth via, and from the fourth circuit pattern to the external electrode through the fifth via.

2. The substrate having an electronic component embedded therein according to claim 1, wherein the lower surface of the second via and an upper surface of the third via are at least partially overlapped with each other while having the first circuit pattern therebetween.

3. The substrate having an electronic component embedded therein according to claim 1, wherein a lower surface of the third via and an upper surface of the fourth via are at least partially overlapped with each other while having the second circuit pattern therebetween.

4. The substrate having an electronic component embedded therein according to claim 1, wherein
   a width of the first circuit pattern at a region including the third via is about 170 to about 200 μm, and
   a difference between a distance between a center line of the first via and a center line of the second via and a distance between the center line of the first via and a center line of the third via is less than 50 μm.

5. The substrate having an electronic component embedded therein according to claim 1, wherein the shortest distance from a sidewall of the electronic component to a center line of the third via is equal to or larger than the sum of a minimum value of an allowable distance between the sidewall of the electronic component and the cavity, a minimum value of an allowable distance between the cavity and the first circuit pattern, and a minimum value of an allowable distance between one side surface of the first circuit pattern and the center line of the third via.

6. The substrate having an electronic component embedded therein according to claim 1, wherein the number of first vias is plural.

7. The substrate having an electronic component embedded therein according to claim 1, wherein the electronic component is a multilayered ceramic capacitor (MLCC).

8. The substrate having an electronic component embedded therein according to claim 7, further comprising an active element having an external terminal contacting the third circuit pattern.

9. The substrate having an electronic component embedded therein according to claim 1, wherein the number of fifth vias is plural.

10. A substrate having an electronic component embedded therein, comprising:
   a first insulating layer including a cavity and having first and second circuit patterns provided on upper and lower surfaces thereof, respectively;
   the electronic component at least partially inserted into the cavity and including an external electrode;
   a plurality of build-up insulating layers stacked on top or beneath the first insulating layer;
   upper and lower circuit patterns formed on the build-up insulating layers, respectively; and
   a plurality of vias interconnecting the external electrode, the upper circuit pattern, the first circuit pattern, the second circuit pattern, and the lower circuit pattern to one another to form an electrical loop,
   wherein at least one of the upper circuit patterns forming the electrical loop is simultaneously connected with at least two of the plurality of vias, and wherein at least one of the lower circuit patterns forming the electrical loop is simultaneously connected with at least two of the plurality of vias.

11. The substrate having an electronic component embedded therein according to claim 10, wherein the plurality of build-up insulating layers include:
a second insulating layer covering the first circuit pattern and the upper surface of the first insulating layer; and
a third insulating layer covering the second circuit pattern and the lower surface of the first insulating layer.

12. The substrate having an electronic component embedded therein according to claim 11, wherein the upper circuit pattern includes a third circuit pattern provided on a surface of the second insulating layer, and
the lower circuit pattern includes a fourth circuit pattern provided on a surface of the third insulating layer.

13. The substrate having an electronic component embedded therein according to claim 12, wherein the plurality of vias include:
a first via directly connecting the external electrode and the third circuit pattern to each other while penetrating through the second insulating layer;
a second via directly connecting the first circuit pattern and the third circuit pattern to each other while penetrating through the second insulating layer;
a third via directly connecting the first circuit pattern and the second circuit pattern to each other while penetrating through the first insulating layer;
a fourth via directly connecting the second circuit pattern and the fourth circuit pattern to each other while penetrating through the third insulating layer; and
a fifth via directly connecting the external electrode and the fourth circuit pattern to each other while penetrating through the third insulating layer.

14. The substrate having an electronic component embedded therein according to claim 13, wherein a lower surface of the second via and an upper surface of the third via are at least partially overlapped with each other while having the first circuit pattern therebetween.

15. The substrate having an electronic component embedded therein according to claim 13, wherein a lower surface of the third via and an upper surface of the fourth via are at least partially overlapped with each other while having the second circuit pattern therebetween.

16. A method of manufacturing a substrate having an electronic component embedded therein, the method comprising:
providing a first insulating layer including a cavity;
inserting at least a portion of the electronic component including an external electrode into the cavity, forming a first circuit pattern on an upper surface of the first insulating layer, forming a second circuit pattern on a lower surface of the first insulating layer, and forming a third via directly connecting the first circuit pattern and the second circuit pattern to each other while penetrating through the first insulating layer;
forming a plurality of build-up insulating layers on and beneath the first insulating layer, respectively;
forming a plurality of via holes penetrating the plurality of build-up insulating layers; and
filling conductive materials in the plurality of via holes to form a plurality of vias and forming an upper circuit pattern and a lower circuit pattern on the build-up insulating layers, respectively,
wherein the external electrode, the upper circuit pattern, the first circuit pattern, the second circuit pattern, and the lower circuit pattern are interconnected to one another by the plurality of vias to form an electrical loop
wherein at least one of the upper circuit patterns forming the electrical loop is simultaneously connected with at least two of the plurality of vias, and at least one of the lower circuit patterns forming the electrical loop is simultaneously connected with at least two of the plurality of vias.

17. The method according to claim 16, wherein the plurality of build-up insulating layers include: a second insulating layer covering the first circuit pattern and the upper surface of the first insulating layer; and a third insulating layer covering the second circuit pattern and the lower surface of the first insulating layer,
the upper circuit pattern includes a third circuit pattern provided on a surface of the second insulating layer,
the lower circuit pattern includes a fourth circuit pattern provided on a surface of the third insulating layer, and
the plurality of vias include:
a first via directly connecting the external electrode and the third circuit pattern to each other while penetrating through the second insulating layer;
a second via directly connecting the first circuit pattern and the third circuit pattern to each other while penetrating through the second insulating layer;
a fourth via directly connecting the second circuit pattern and the fourth circuit pattern to each other while penetrating through the third insulating layer; and
a fifth via directly connecting the external electrode and the fourth circuit pattern to each other while penetrating through the third insulating layer.

18. The method according to claim 17, wherein a lower surface of the second via and an upper surface of the third via are at least partially overlapped with each other while having the first circuit pattern therebetween.

19. A substrate having an electronic component embedded therein, comprising:
a first insulating layer including a cavity;
a second insulating layer stacked on an upper surface of the first insulating layer;
a third insulating layer stacked on a lower surface of the first insulating layer;
the electronic component at least partially inserted into the cavity and including an external electrode;
a circuit pattern on an upper surface of the second insulating layer;
a first via penetrating through a portion of the second insulating layer above the electronic component and connecting the external electrode with the circuit pattern;
a second via connected to the circuit pattern and penetrating through the second insulating layer;
a third via penetrating through a portion of the first insulating layer outside the cavity, connected to the second via, and positioned under a portion of the second via;
a fourth via penetrating through the third insulating layer, connected to the third via, and positioned under a portion of the third via; and
a fifth via directly connecting the external electrode and the fourth circuit pattern to each other while penetrating through the third insulating layer,
wherein an electrical loop is formed by connections from the external electrode to the third circuit pattern through the first via, from the third circuit pattern to the first circuit pattern through the second via, from the first circuit pattern to the second circuit pattern through the third via, from the second circuit pattern to the fourth circuit pattern through the fourth via, and from the fourth circuit pattern to the external electrode through the fifth via.

20. The substrate having an electronic component embedded therein according to claim 19, wherein a bottom end of the fourth via is connected to the external electrode by an electrically conductive path that runs under the cavity, so as to form an electrical loop that has a portion through the cavity and another portion through the first insulating layer.

21. The substrate having an electronic component embedded therein according to claim 19, wherein the second and third insulating layers have respective thicknesses less than that of first insulating layer, and the second and third insulating layers are in contact with the first insulating layer.

22. The substrate having an electronic component embedded therein according to claim 19, further comprising:
    another via penetrating through another portion of the second insulating layer above the electronic component and connecting the external electrode with the circuit pattern.

\* \* \* \* \*